(12) United States Patent
Stephens et al.

(10) Patent No.: US 9,812,396 B1
(45) Date of Patent: Nov. 7, 2017

(54) INTERCONNECT STRUCTURE FOR SEMICONDUCTOR DEVICES WITH MULTIPLE POWER RAILS AND REDUNDANCY

(71) Applicant: GLOBALFOUNDRIES Inc., Grand Cayman (KY)

(72) Inventors: Jason Eugene Stephens, Menands, NY (US); Guillaume Bouche, Albany, NY (US); Shreesh Narasimha, Beacon, NY (US); Patrick Ryan Justison, Clifton Park, NY (US); Byoung Youp Kim, Schenectady, NY (US); Craig Michael Child, Jr., Gansevoort, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/175,495

(22) Filed: Jun. 7, 2016

(51) Int. Cl.
*H01L 21/768* (2006.01)
*H01L 23/528* (2006.01)
*H01L 23/522* (2006.01)
*H01L 21/311* (2006.01)

(52) U.S. Cl.
CPC .... *H01L 23/5286* (2013.01); *H01L 21/31144* (2013.01); *H01L 21/7684* (2013.01); *H01L 21/76802* (2013.01); *H01L 21/76807* (2013.01); *H01L 21/76883* (2013.01); *H01L 23/5226* (2013.01); *H01L 23/5283* (2013.01)

(58) Field of Classification Search
CPC ......... H01L 21/31144; H01L 21/76802; H01L 21/76807; H01L 21/76819; H01L 21/7684; H01L 21/76883; H01L 23/5226; H01L 23/5283; H01L 23/5286
See application file for complete search history.

(56) References Cited

U.S. PATENT DOCUMENTS

| | | | | |
|---|---|---|---|---|
| 5,742,099 A * | 4/1998 | Debnath | ............. | H01L 23/5286 257/207 |
| 8,106,721 B2 * | 1/2012 | Tzuang | ................... | H01P 3/088 333/1 |
| 8,507,957 B2 * | 8/2013 | Hou | ..................... | H01L 27/0207 257/288 |
| 2003/0201472 A1 * | 10/2003 | Ho | ...................... | H01L 23/5225 257/207 |
| 2007/0033548 A1 * | 2/2007 | Tatsumi | ............. | H01L 27/0207 257/371 |

(Continued)

*Primary Examiner* — Stephen W Smoot
(74) *Attorney, Agent, or Firm* — Wayne F. Reinke, Esq.; Heslin Rothenberg Farley & Mesiti P.C.

(57) ABSTRACT

A method includes providing a starting interconnect structure for semiconductor device(s), the starting interconnect structure including a first metallization layer with a first power rail. The method further includes forming a second metallization layer over the first metallization layer with a second power rail, and directly electrically connecting the first power rail and the second power rail, the directly electrically connecting including forming metal-filled vias between the first power rail and the second power rail. The method further includes forming additional metallization layer(s) over the second metallization layer with additional power rail(s), and directly electrically connecting each of the additional power rail(s) to a power rail of a metallization layer directly below.

8 Claims, 13 Drawing Sheets

(56) References Cited

U.S. PATENT DOCUMENTS

| | | | |
|---|---|---|---|
| 2007/0074134 A1* | 3/2007 | Katoh | H03K 19/0016 257/499 |
| 2008/0180132 A1* | 7/2008 | Ishikawa | H01L 23/5223 326/101 |
| 2014/0246791 A1* | 9/2014 | Stephens | H01L 21/76877 257/786 |
| 2014/0252650 A1* | 9/2014 | Utsumi | H01L 23/5286 257/774 |
| 2015/0115400 A1* | 4/2015 | Christiansen | H01L 23/5256 257/529 |

* cited by examiner

INTERCONNECT STRUCTURE FOR SEMICONDUCTOR DEVICES WITH MULTIPLE POWER RAILS AND REDUNDANCY

BACKGROUND OF THE INVENTION

Technical Field

The present invention generally relates to interconnect structures for semiconductor devices. More particularly, the present invention relates to interconnect structures with multiple power rails and redundancy.

Background Information

Currently, interconnect structures for semiconductor devices typically include a single power rail with few connections (and higher resistive paths). This design has a number of shortcomings, including, for example, no power rail redundancy. If the power rail fails, the device fails.

Thus, a need exists for an improved interconnect structure design.

SUMMARY OF THE INVENTION

The shortcomings of the prior art are overcome and additional advantages are provided through the provision, in one aspect, of a method of forming an interconnect structure. The method includes providing a starting interconnect structure for one or more semiconductor devices, the starting interconnect structure including a first metallization layer with a first power rail. The method further includes forming a second metallization layer over the first metallization layer with a second power rail, and directly electrically connecting the first power rail and the second power rail.

In accordance with another aspect, an interconnect structure for one or more semiconductor devices is provided. The interconnect structure includes a first metallization layer having at least one first power rail, a second metallization layer having at least one power rail, and a direct electrical connection between each power rail of the first metallization layer and a corresponding power rail of the second metallization layer.

In accordance with yet another aspect, a semiconductor structure is provided. The semiconductor structure includes a first metallization layer of an interconnect structure, the first metallization layer having one or more power rails, a dielectric stack above the first metallization layer, a plurality of trench spacers, a hard mask layer portion only directly under each of the plurality of trench spacers, and a plurality of vias in the dielectric stack in areas lacking spacers thereabove.

These, and other objects, features and advantages of this invention will become apparent from the following detailed description of the various aspects of the invention taken in conjunction with the accompanying drawings.

DETAILED DESCRIPTION OF THE INVENTION

Figure 1:
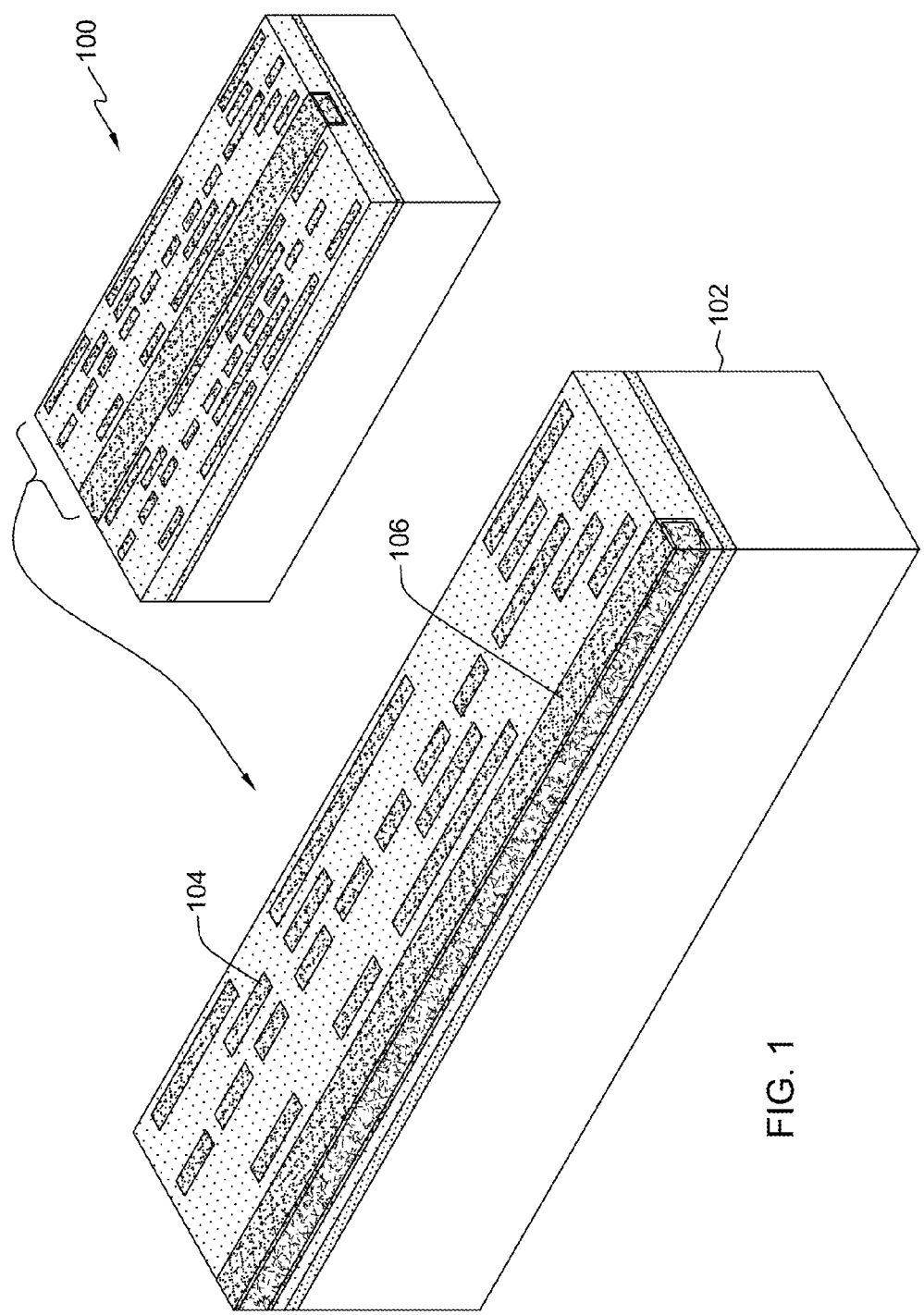
FIG. 1 depicts one example of a starting interconnect structure for one or more semiconductor devices (shown as a generic block), the starting interconnect structure including a first metal layer and a power rail, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

FIG. 1 depicts one example of a starting interconnect structure 100 for one or more semiconductor devices 102 (shown as a generic block), the starting interconnect structure including a first metal layer 104 and power rail 106, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention.

Figure 2:
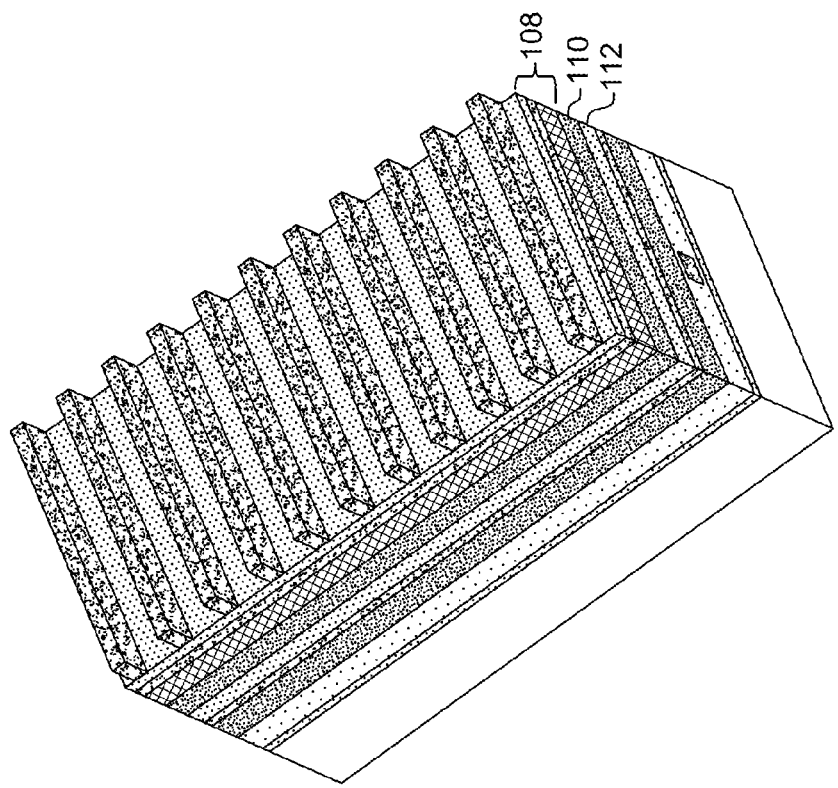
FIG. 2 depicts one example of the starting interconnect structure of FIG. 1 after forming several layers, including a lithographic stack for forming mandrels in a mandrel layer, and a hard mask, in accordance with one or more aspects of the present invention.

FIG. 2 depicts one example of the starting interconnect structure 100 of FIG. 1 after forming several layers, including a lithographic stack 108 for forming mandrels in a mandrel layer 110, and a hard mask layer 112, in accordance with one or more aspects of the present invention.

In one example, the mandrel layer 110 may include, for example, amorphous silicon. In one example, lithographic stack 108 may include, from bottom to top, a layer of spin-on hard mask (SOH), a layer of silicon oxy-nitride (SiON), a layer of a bottom anti-reflection coating (BARC) and photoresist at the top.

Figure 3:
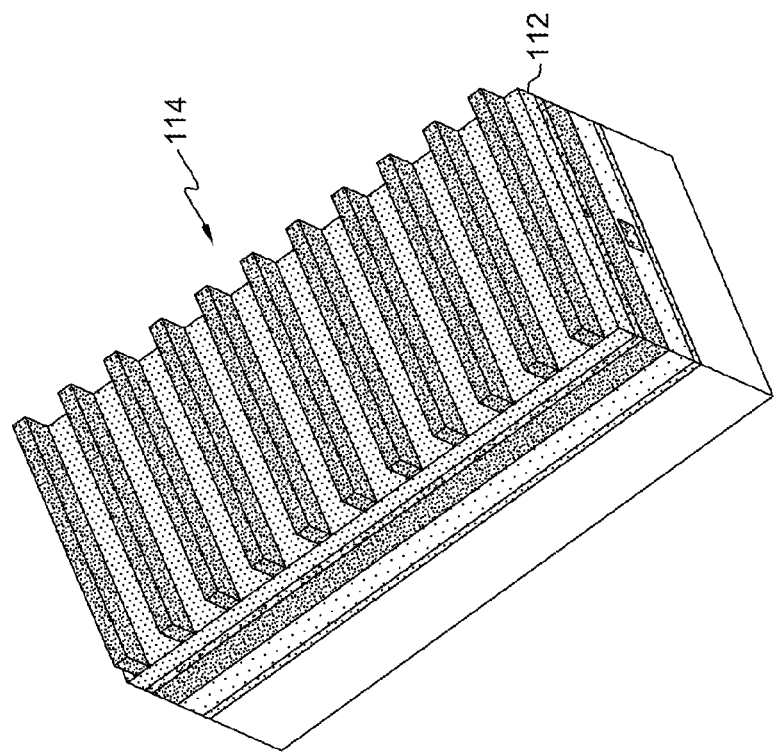
FIG. 3 depicts one example of the structure of FIG. 2 after performing lithography and etching to form mandrel strips out of the mandrel layer, including removal of the lithographic stack, in accordance with one or more aspects of the present invention.

FIG. 3 depicts one example of the structure of FIG. 2 after performing lithography and etching to form mandrel strips 114 out of the mandrel layer (110, FIG. 2), including removal of the lithographic stack (108, FIG. 2), in accordance with one or more aspects of the present invention.

Figure 4:
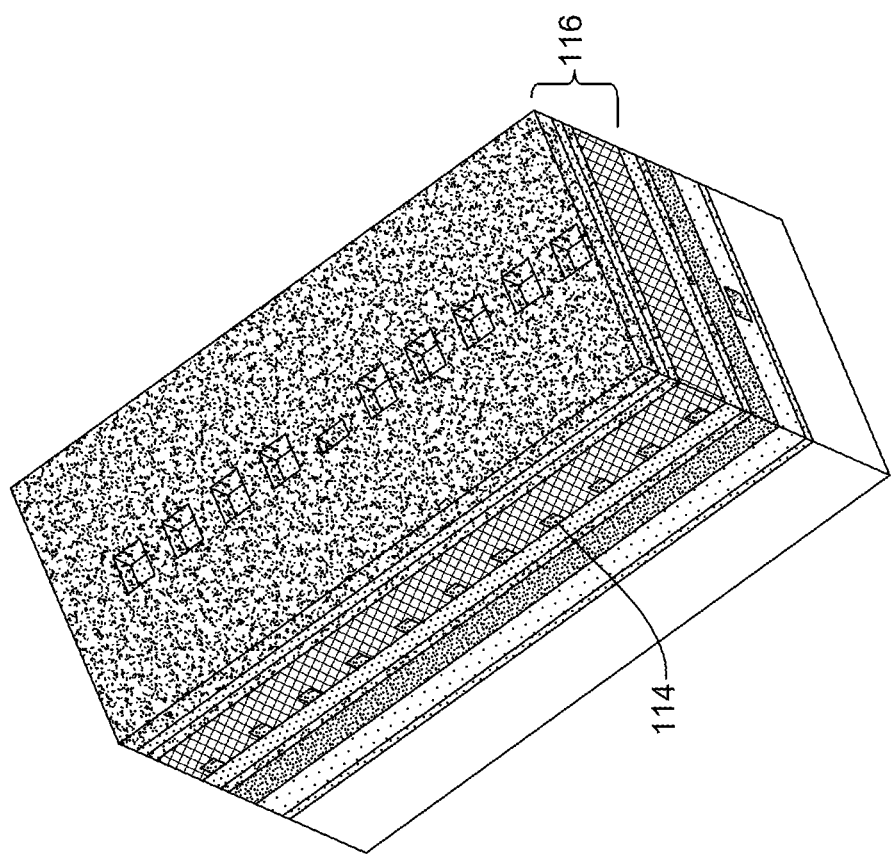
FIG. 4 depicts one example of the structure of FIG. 3 after forming another lithographic stack over the mandrel strips, in order to cut the mandrel strips, in accordance with one or more aspects of the present invention.

FIG. 4 depicts one example of the structure of FIG. 3 after forming another lithographic stack 116 (e.g., similar to lithographic stack 108 of FIG. 1) over the mandrel strips 114, in order to cut the mandrel strips, in accordance with one or more aspects of the present invention.

Figure 5:
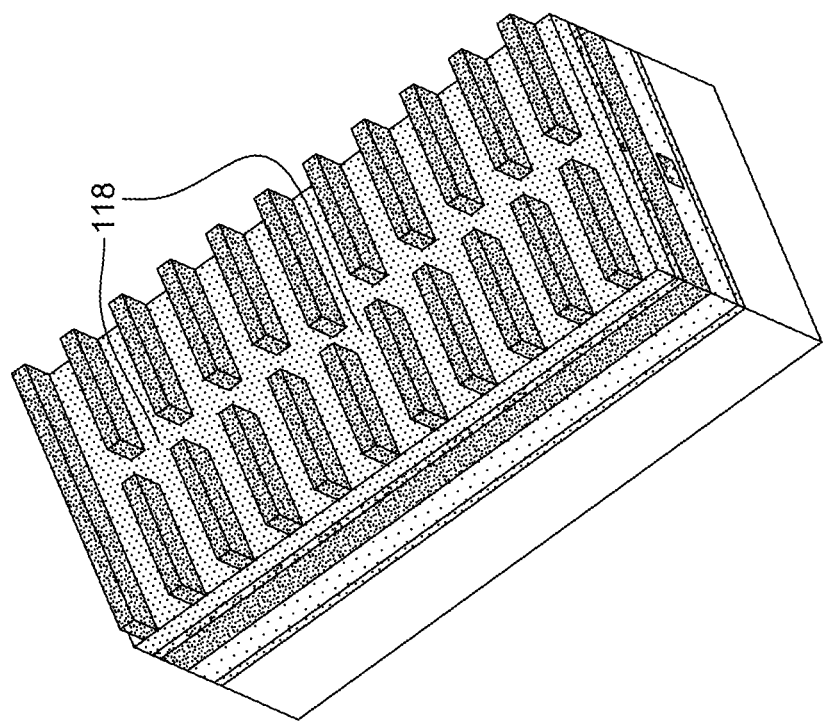
FIG. 5 depicts one example of the structure of FIG. 4 after making the cuts in the mandrel strips and removing the lithographic stack, in accordance with one or more aspects of the present invention.

FIG. 5 depicts one example of the structure of FIG. 4 after making the cuts 118 in the mandrel strips (114, FIG. 3) and removing the lithographic stack (116, FIG. 4), in accordance with one or more aspects of the present invention.

Figure 6:
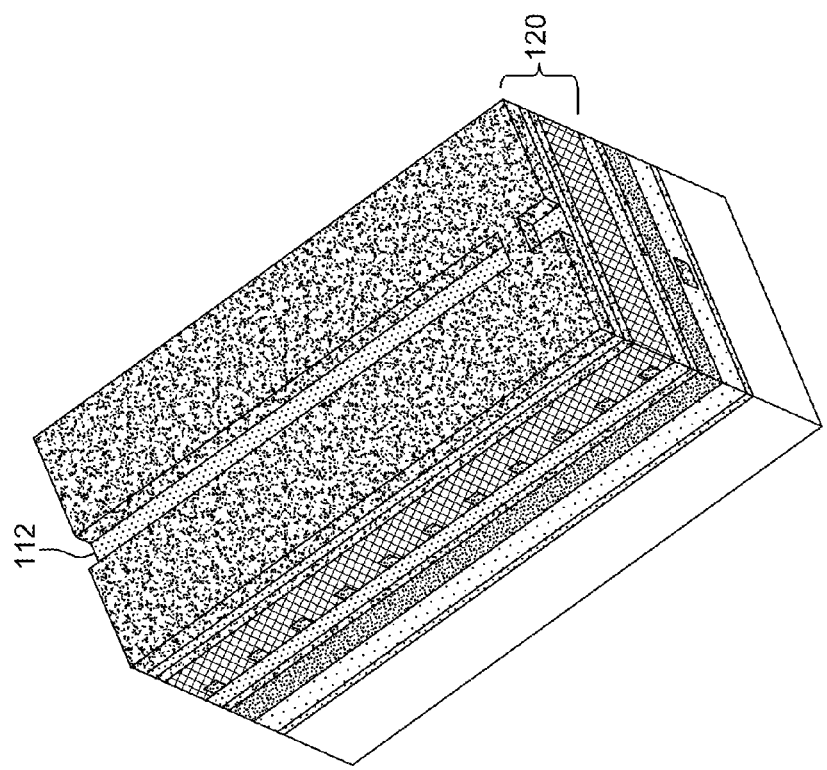
FIG. 6 depicts one example of the structure of FIG. 5 after forming a third lithographic stack to remove portions of the hard mask layer, in accordance with one or more aspects of the present invention.

FIG. 6 depicts one example of the structure of FIG. 5 after forming a third lithographic stack 120 (e.g., similar to lithographic stack 108 of FIG. 1) to remove portions of hard mask layer 112 (e.g., center portions), in accordance with one or more aspects of the present invention.

Figure 7:
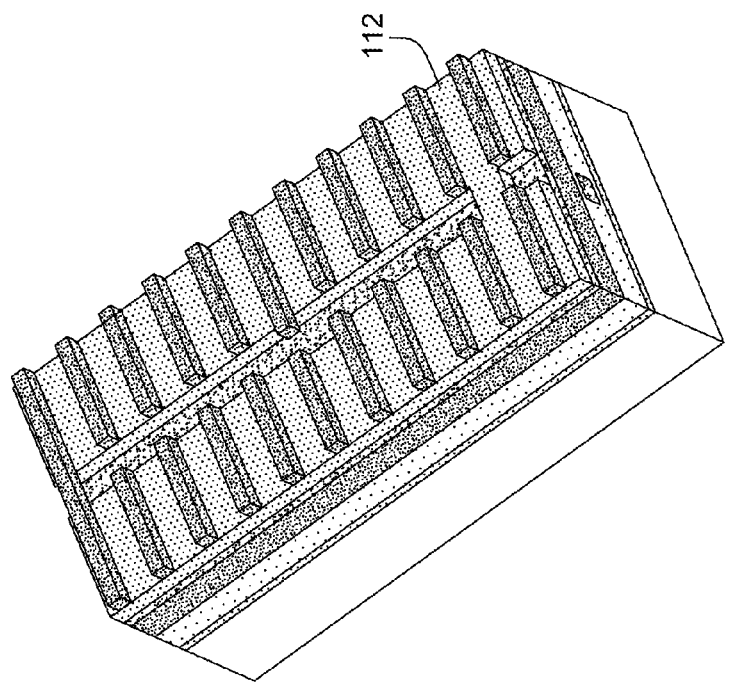
FIG. 7 depicts one example of the structure of FIG. 6 after removing the portions of the hard mask layer, as well as removing the lithographic stack, in accordance with one or more aspects of the present invention.

FIG. 7 depicts one example of the structure of FIG. 6 after removing the portions of hard mask layer 112, as well as removing the lithographic stack (120, FIG. 6), in accordance with one or more aspects of the present invention.

Figure 8:
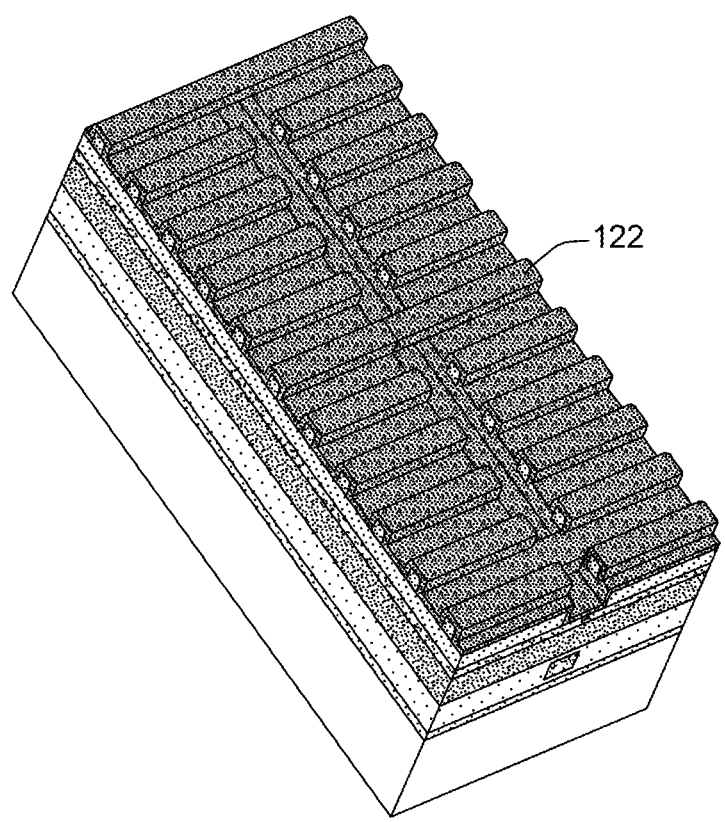
FIG. 8 depicts one example of the structure of FIG. 7 after forming a blanket conformal layer of oxide (e.g., amorphous silicon), in accordance with one or more aspects of the present invention.

FIG. 8 depicts one example of the structure of FIG. 7 after forming a blanket conformal layer 122 of oxide (e.g., amorphous silicon), in accordance with one or more aspects of the present invention.

Figure 9:
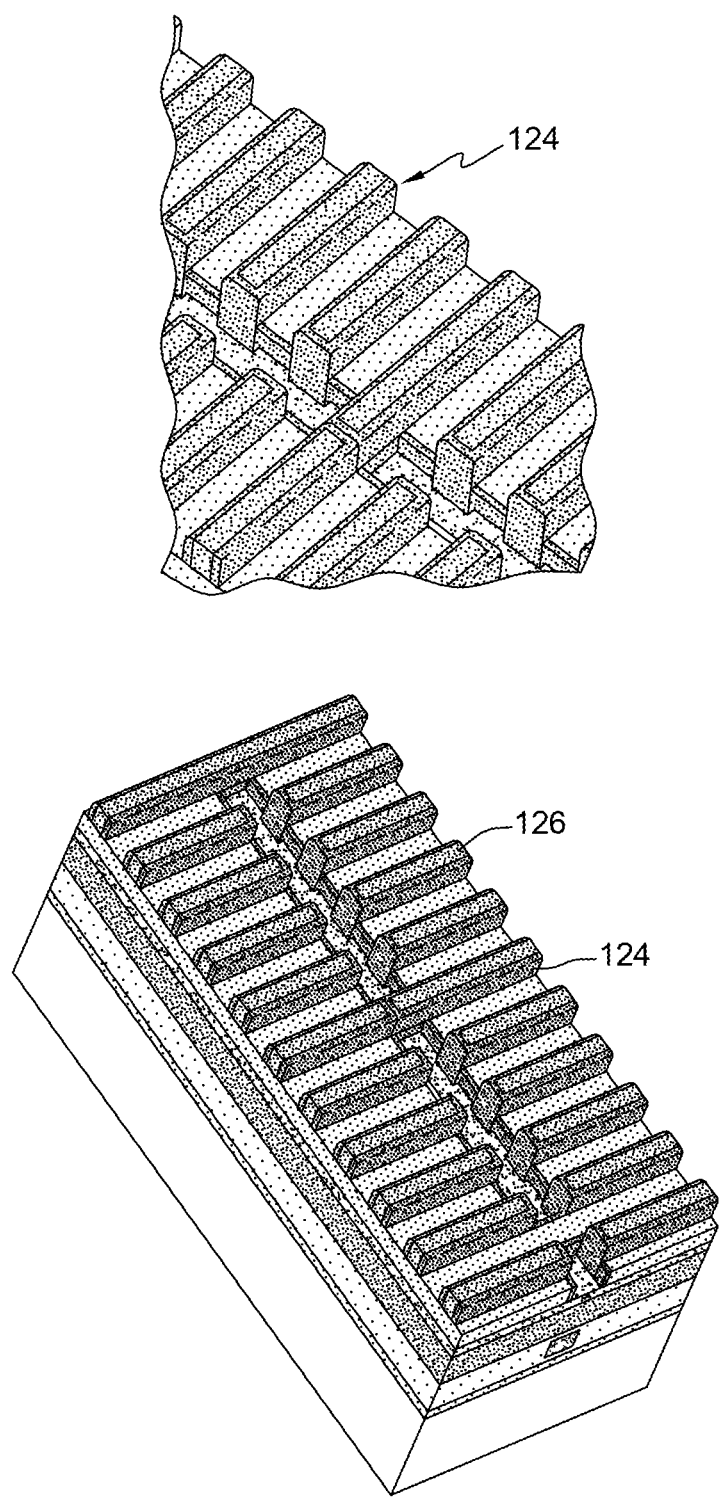
FIG. 9 depicts one example of the structure of FIG. 8 after selectively removing portions of the oxide layer, effectively forming spacers around the cut mandrels, in accordance with one or more aspects of the present invention.

FIG. 9 depicts one example of the structure of FIG. 8 after selectively removing portions of oxide layer 122 (e.g., selective etch), effectively forming spacers (e.g., spacer 124) around the cut mandrels 126, in accordance with one or more aspects of the present invention. Note that other spacer shapes could instead be used.

Figure 10:
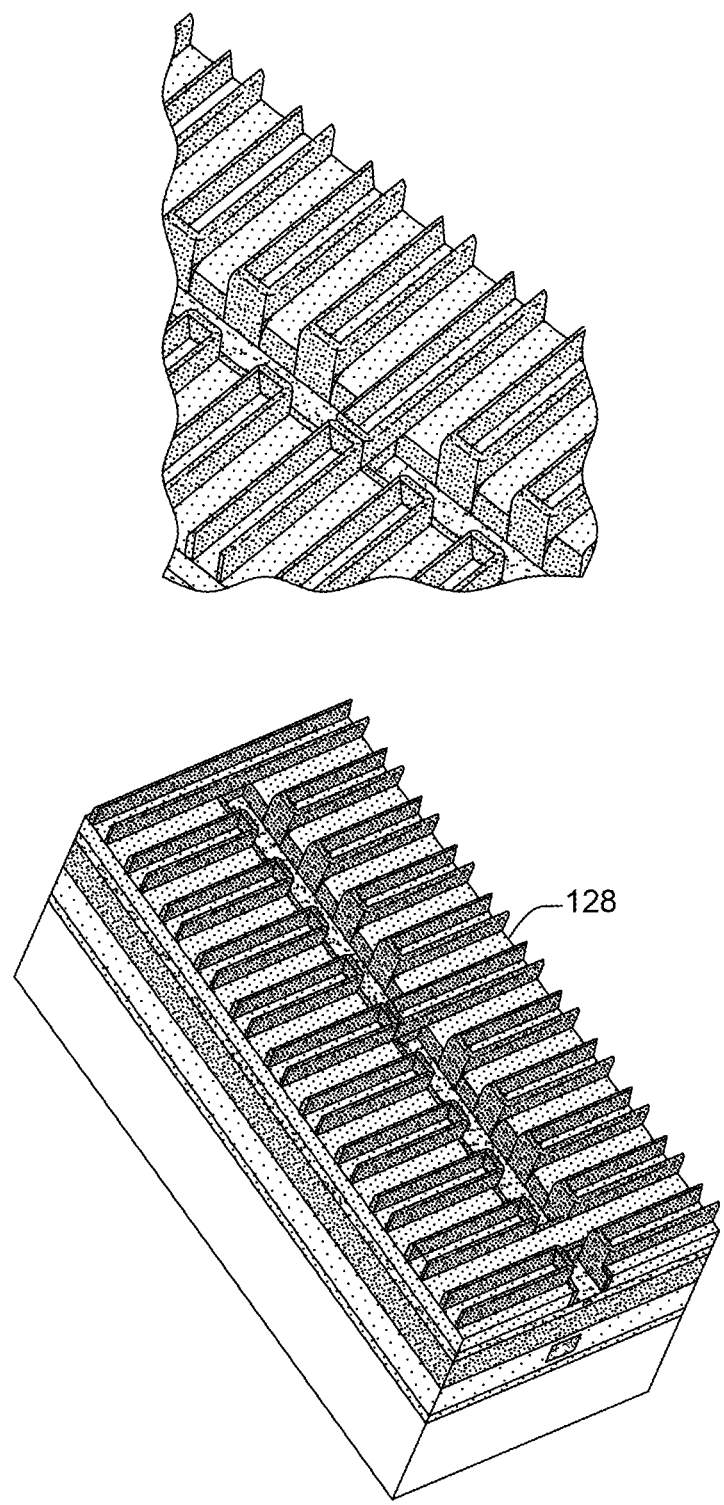
FIG. 10 depicts one example of the structure of FIG. 9 after selective removal of the cut mandrels, exposing portions of the hard mask layer, in accordance with one or more aspects of the present invention.

FIG. 10 depicts one example of the structure of FIG. 9 after selective removal of the cut mandrels (126, FIG. 9), exposing portions 128 of the hard mask layer (112, FIG. 3), in accordance with one or more aspects of the present invention.

Figure 11:
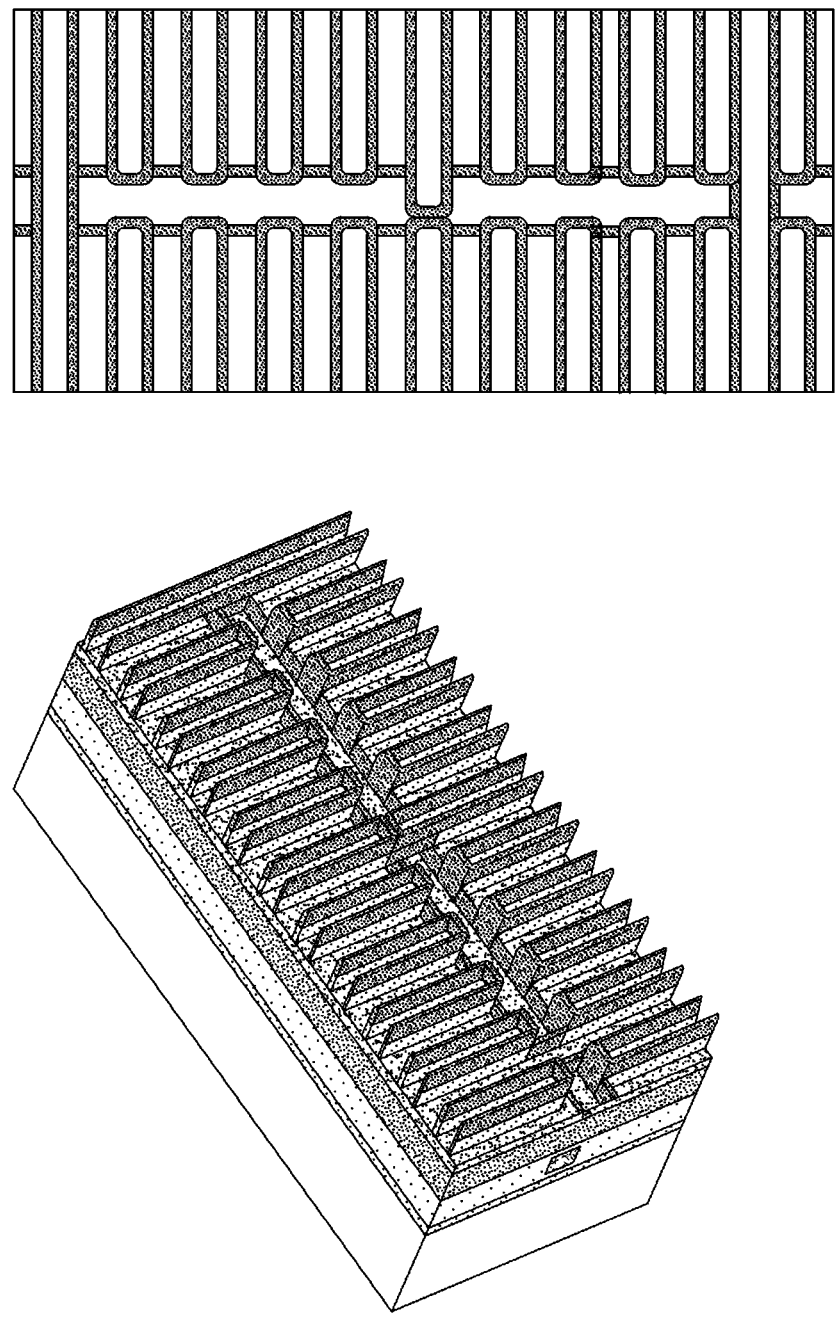
FIG. 11 depicts one example of the structure of FIG. 10 after removing exposed portions of the hard mask layer, in accordance with one or more aspects of the present invention.

FIG. 11 depicts one example of the structure of FIG. 10 after removing exposed portions (128, FIG. 10) of the hard mask layer (112, FIG. 3), in accordance with one or more aspects of the present invention.

Figure 12:
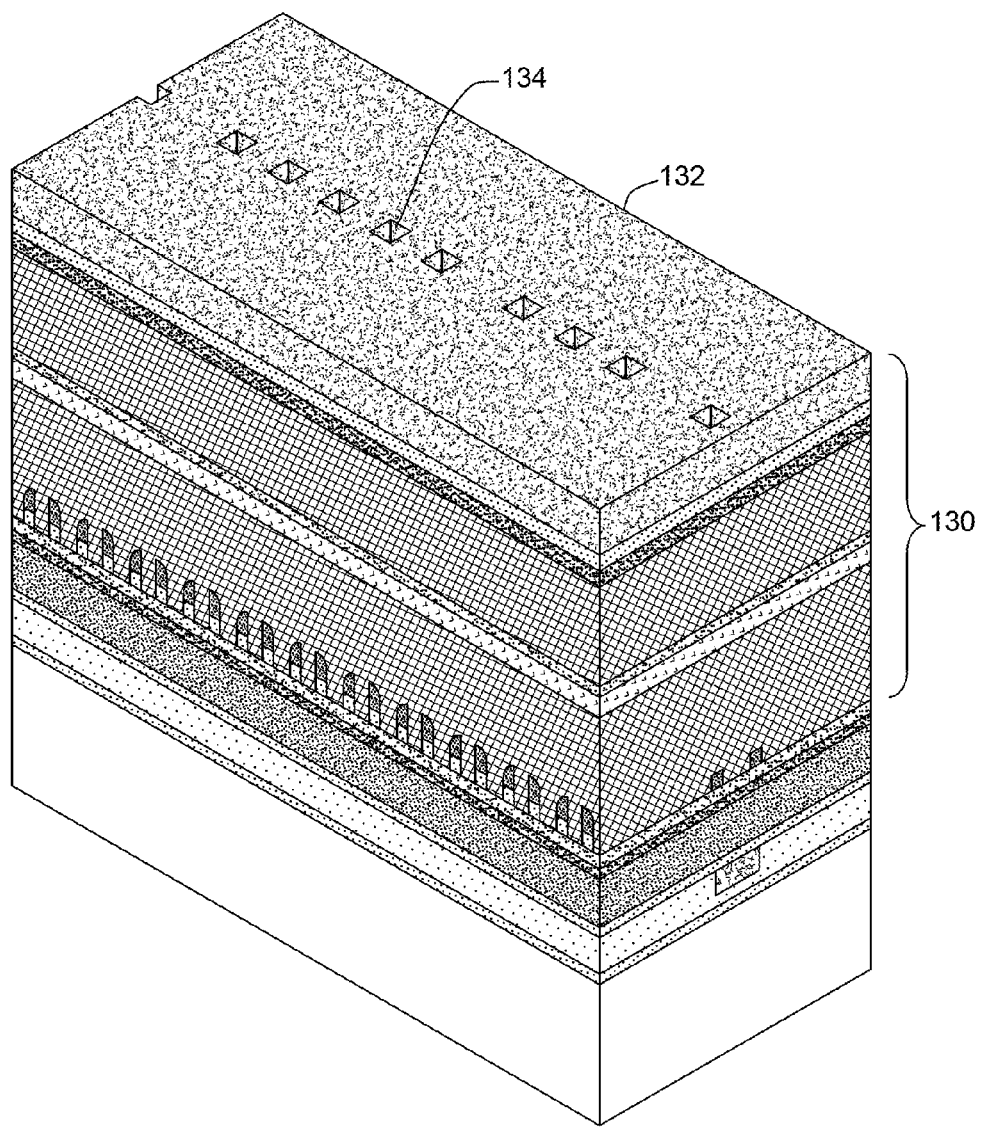
FIG. 12 depicts one example of the structure of FIG. 11 after forming a lithographic stack, including a lithographic blocking layer, and after removing portions of the lithographic blocking layer, in accordance with one or more aspects of the present invention.

FIG. 12 depicts one example of the structure of FIG. 11 after forming still another lithographic stack 130 (e.g., similar to other stacks herein), including lithographic blocking layer 132, and after removing portions 134 of the lithographic blocking layer, in accordance with one or more aspects of the present invention.

Figure 13:
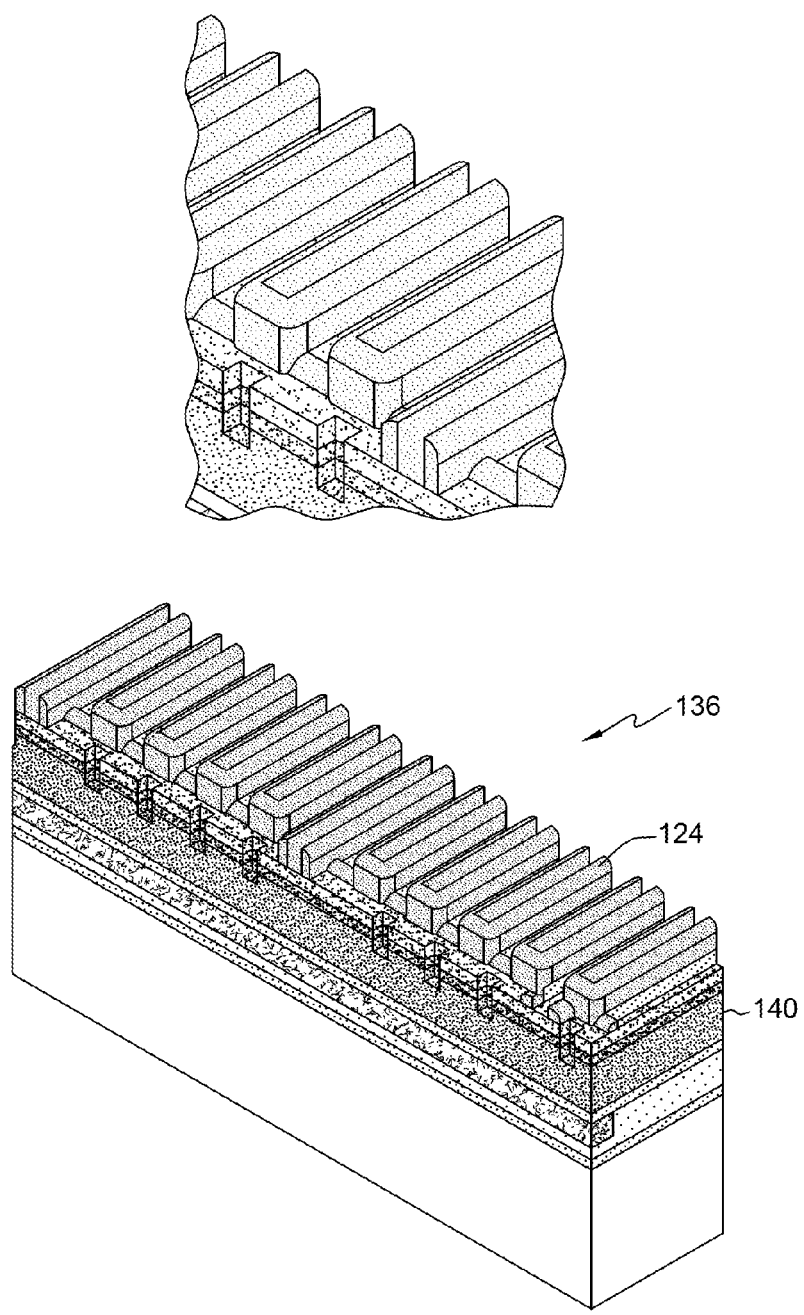
FIG. 13 depicts one example of half of the structure of FIG. 12 (the half not shown being a mirror image) after removing portions of layers below a center of the structure, to form vias, in accordance with one or more aspects of the present invention.

FIG. 13 depicts one example of half 136 of the structure of FIG. 12 (the half not shown being a mirror image) after removing portions of layers below a center of the structure, to form vias 138, which ultimately allow for direct electrical connections between power rails or vertically adjacent layers, in accordance with one or more aspects of the present invention.

Figure 14:
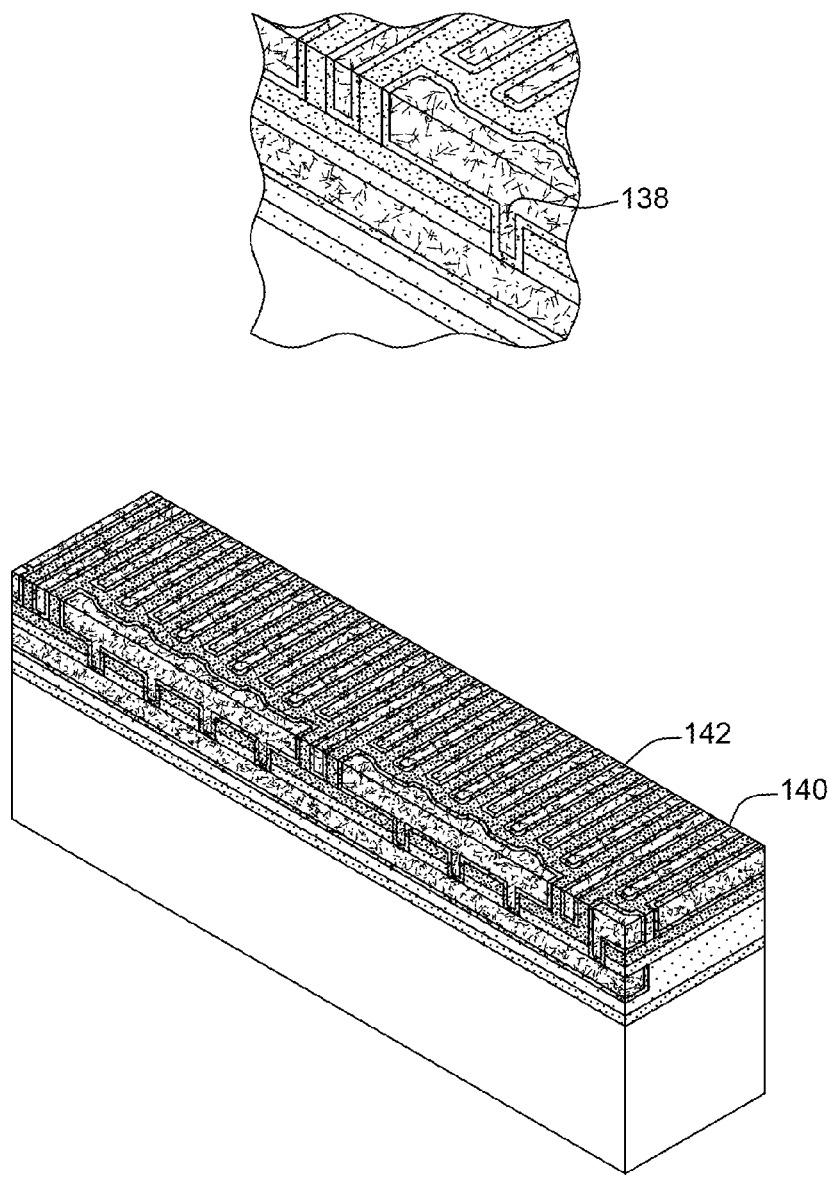
FIG. 14 depicts one example of the half structure of FIG. 13 after removing portions of the layers not covered by the spacers, forming trenches in the layer 140 (see also, FIG. 13), filling of the trenches and the vias with metal, and planarizing down to the layer, in accordance with one or more aspects of the present invention.

FIG. 14 depicts one example of the half structure of FIG. 13 after removing portions of the layers not covered by the spacers (e.g., spacer 124, FIG. 13), forming trenches in layer 140 (see also, FIG. 13), filling of the trenches and the vias 138 with metal, and planarizing down to layer 140, in accordance with one or more aspects of the present invention.

Figure 15:
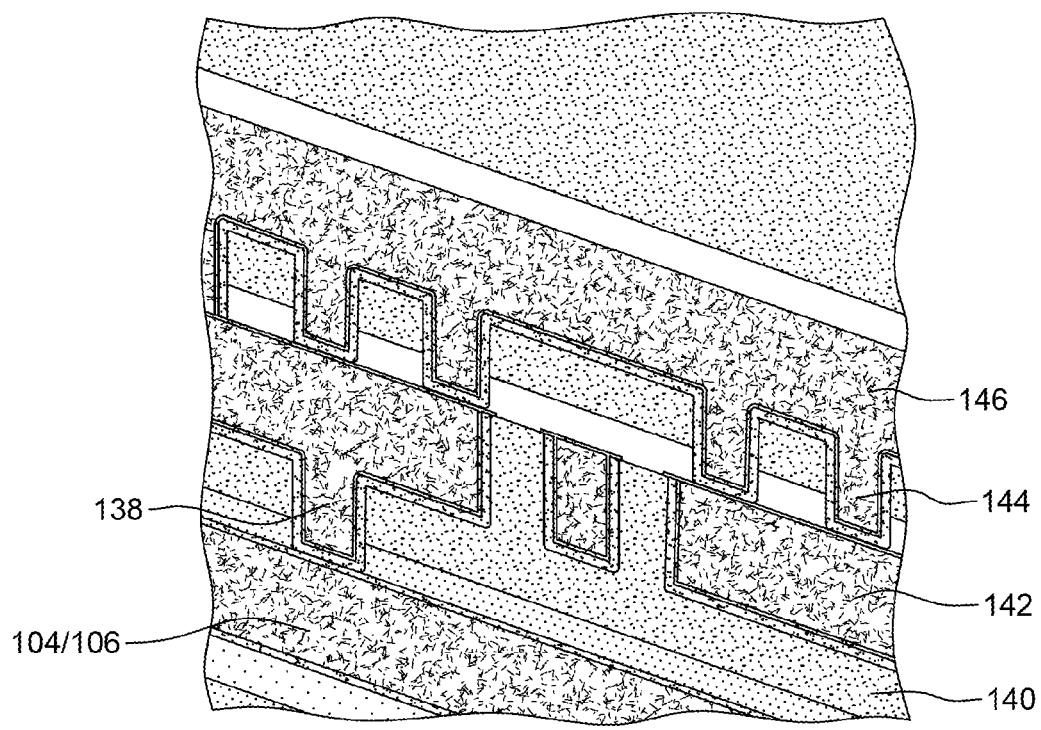
FIG. 15 depicts one example of the half structure of FIG. 14 after forming additional vias and a third metal layer, thereover, in accordance with one or more aspects of the present invention.

FIG. 15 depicts one example of a portion of the half structure of FIG. 14 after forming additional vias 144 and a third metal layer 146, thereover, in accordance with one or more aspects of the present invention.

Figure 16:
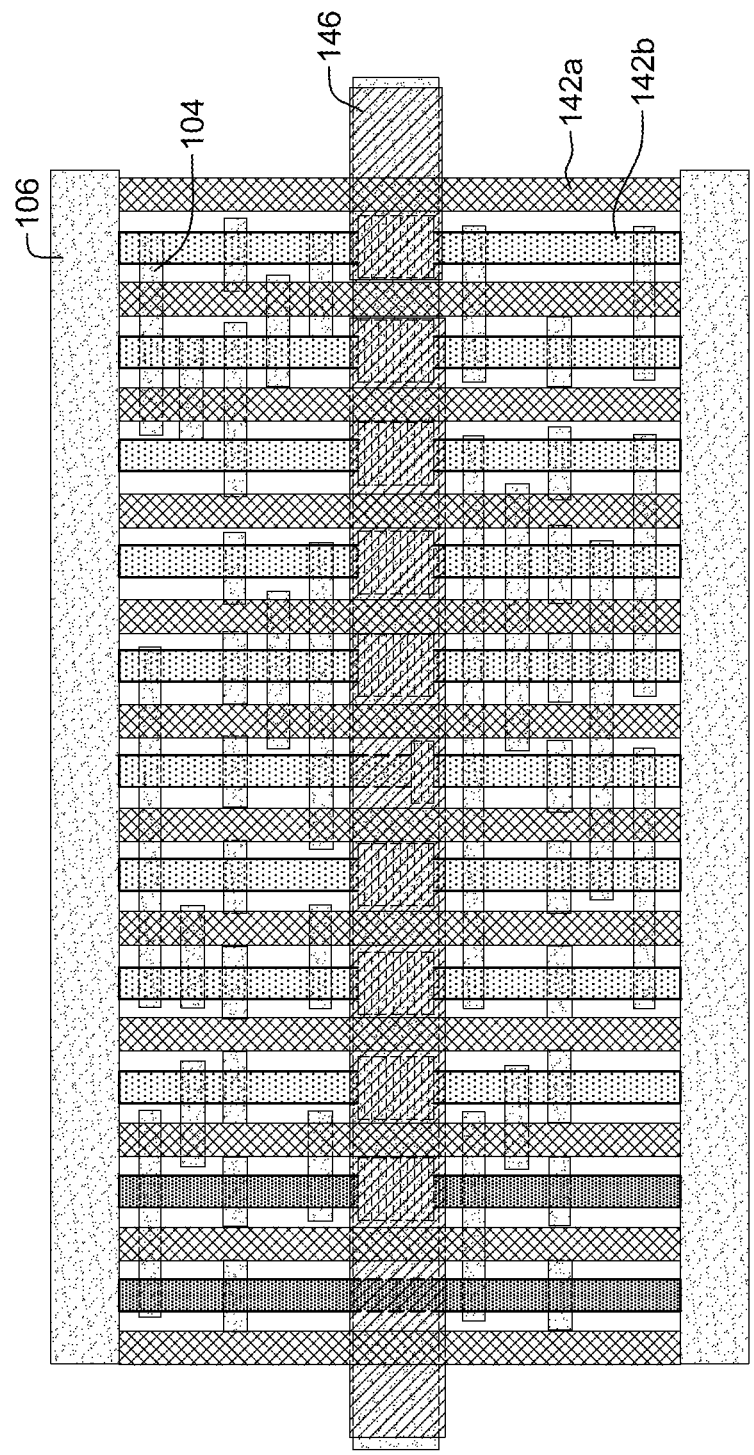
FIG. 16 is a top-down view of one example of a full structure corresponding to the half structure of FIG. 15, including the first metal layer power rails and the first layer of cut metal lines, a second metal layer (one was not formed with the mandrels, while the other was), and a third metal layer, in accordance with one or more aspects of the present invention.

FIG. 16 is a top-down view of one example of a full structure corresponding to the half structure of FIG. 15, including first metal layer power rails 106 and first layer of cut metal lines 104, a second metal layer 142, and third metal layer 146 with associated filled vias 144, in accordance with one or more aspects of the present invention.

In a first aspect, disclosed above is a method. The method includes providing a starting interconnect structure for semiconductor device(s), the starting interconnect structure including a first metallization layer with a first power rail. The method further includes forming a second metallization layer over the first metallization layer with a second power rail, and directly electrically connecting the first power rail and the second power rail.

In one example, the directly electrically connecting may include, for example, forming metal-filled via(s) between the first power rail and the second power rail.

In one example, the method of the first aspect may further include, for example, forming additional metallization layer(s) over the second metallization layer with additional power rail(s), and directly electrically connecting each power rail to a power rail of a metallization layer directly below.

In one example, the forming of the second metallization layer in the method of the first aspect may include, for example, forming a hard mask layer, forming spacers on the hard mask layer, removing portions of the hard mask layer not covered by the spacers, forming via(s), forming trenches using the spacers, and filling the trenches and vias with metal, each filled via electrically connected to one of the filled trenches. In one example, the spacers are formed using mandrel line(s), one or more of the mandrel line(s) being cut.

In one example, the spacers may be, for example, formed around the mandrel line(s), and the vias may be formed below the mandrels. In one example, forming the mandrel lines, cutting one or more thereof, forming the via(s) and forming the trenches may each include, for example, using lithography and etching.

In one example, where the filled trenches and via(s) are present, the method may further include, for example, planarizing after the filling.

In one example, where the hard mask layer with portions removed is present, the method may further include, for example, removing portion(s) of the hard mask layer at any cut of the mandrel line(s).

In one example, forming the spacers may include, for example, forming a blanket layer of mandrel material, and removing portions of the blanket layer of mandrel material.

In a second aspect, disclosed above is an interconnect structure for semiconductor device(s), the interconnect structure including a first metallization layer having first power rail(s), a second metallization layer having power rail(s), and a direct electrical connection between each power rail of the first metallization layer and a corresponding power rail of the second metallization layer. In one example, the direct electrical connection may include, for example, metal-filled via(s).

In one example, the interconnect structure of the second aspect may further include, for example, additional metallization layer(s) having power rail(s), and a direct electrical connection between each power rail of a given metallization layer and a corresponding power rail in a metallization layer directly therebelow.

In a third aspect, disclosed above is a semiconductor structure. The semiconductor structure includes a first metallization layer of an interconnect structure, the first metallization layer having power rail(s), a dielectric stack above the first metallization layer, trench spacers, a hard mask layer portion only directly under each of the trench spacers, and vias in the dielectric stack in areas lacking spacers thereabove.

In one example, the semiconductor structure may further include, for example, metallization trenches in the dielectric stack in areas delineated by the trench spacers. In one example, the semiconductor structure may further include, for example, metal in the metallization trenches and the vias, the filled metallization trenches and filled vias including a second metallization layer, the filled metallization trenches including power rail(s), and the filled vias directly electrically connecting corresponding power rails in the first and second metallization layers.

In one example, the trench spacers of the semiconductor structure of the third aspect may include, for example, U-shaped spacers.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:
1. A method, comprising:
providing a starting interconnect structure for one or more semiconductor devices, the starting interconnect structure comprising a first metallization layer with a first power rail;
forming a second metallization layer over the first metallization layer with a second power rail;

directly electrically connecting the first power rail and the second power rail;

wherein the directly electrically connecting comprises forming a plurality of metal-filled vias between the first power rail and the second power rail;

forming at least one additional metallization layer over the second metallization layer with at least one additional power rail; and directly electrically connecting each of the at least one additional power rail to a power rail of a metallization layer directly below.

2. A method, comprising:

providing a starting interconnect structure for one or more semiconductor devices, the starting interconnect structure comprising a first metallization layer with a first power rail;

forming a second metallization layer over the first metallization layer with a second power rail;

directly electrically connecting the first power rail and the second power rail;

wherein the directly electrically connecting comprises forming a plurality of metal-filled vias between the first power rail and the second power rail; and wherein forming the second metallization layer comprises:
  forming a hard mask layer;
  forming spacers on the hard mask layer;
  removing portions of the hard mask layer not covered by the spacers;
  forming one or more vias;
  forming a plurality of trenches using the spacers; and
  filling the trenches and vias with metal, each filled via electrically connected to one of the filled plurality of trenches.

3. The method of claim 2, wherein the spacers are formed using one or more mandrel lines, one or more of the one or more mandrel lines being cut.

4. The method of claim 3, wherein the spacers are formed around the one or more mandrel lines, and wherein the vias are formed below the mandrels.

5. The method of claim 4, wherein forming the plurality of mandrel lines, cutting one or more thereof, forming the one or more vias and forming the plurality of trench each comprise using lithography and etching.

6. The method of claim 3, further comprising removing one or more portions of the hard mask layer at any cut of the one or more mandrel lines.

7. The method of claim 2, further comprising planarizing after the filling.

8. The method of claim 2, wherein forming the spacers comprises:
  forming a blanket layer of mandrel material; and
  removing portions of the blanket layer of mandrel material.

* * * * *